United States Patent
Collins et al.

(10) Patent No.: US 7,208,330 B2
(45) Date of Patent: Apr. 24, 2007

(54) METHOD FOR VARYING THE UNIFORMITY OF A DOPANT AS IT IS PLACED IN A SUBSTRATE BY VARYING THE SPEED OF THE IMPLANT ACROSS THE SUBSTRATE

(75) Inventors: Sean M. Collins, Richardson, TX (US); Jeffrey G. Loewecke, Wylie, TX (US); James D. Bernstein, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/033,939

(22) Filed: Jan. 12, 2005

(65) Prior Publication Data

US 2006/0154457 A1 Jul. 13, 2006

(51) Int. Cl.
*G01R 31/26* (2006.01)
(52) U.S. Cl. .................. 438/14; 438/514; 257/E21.135
(58) Field of Classification Search ............. 438/514, 438/14; 257/E21.135
See application file for complete search history.

(56) References Cited

U.S. PATENT DOCUMENTS

| | | | | |
|---|---|---|---|---|
| 4,283,631 A * | 8/1981 | Turner | | 376/435 |
| 4,736,107 A * | 4/1988 | Myron | | 250/492.2 |
| 4,922,106 A * | 5/1990 | Berrian et al. | | 250/492.2 |
| 4,980,562 A * | 12/1990 | Berrian et al. | | 250/492.2 |
| 5,121,185 A * | 6/1992 | Tamba et al. | | 257/553 |
| 5,627,105 A * | 5/1997 | Delfino et al. | | 438/627 |
| 5,963,799 A * | 10/1999 | Wu | | 438/199 |
| 6,097,064 A * | 8/2000 | Saitoh et al. | | 257/345 |
| 6,107,108 A * | 8/2000 | Chen et al. | | 438/14 |
| 6,107,149 A * | 8/2000 | Wu et al. | | 438/303 |
| 6,187,643 B1 * | 2/2001 | Borland | | 438/302 |
| 6,346,463 B1 * | 2/2002 | Sultan et al. | | 438/510 |
| 6,580,083 B2 * | 6/2003 | Berrian | | 250/492.21 |
| 6,710,359 B2 * | 3/2004 | Olson et al. | | 250/492.21 |
| 2004/0007679 A1 * | 1/2004 | Viviani | | 250/492.21 |
| 2005/0002236 A1 * | 1/2005 | Morikawa et al. | | 365/185.14 |
| 2005/0093033 A1 * | 5/2005 | Kinoshita et al. | | 257/288 |
| 2005/0127439 A1 * | 6/2005 | Matsuzaki et al. | | 257/341 |
| 2005/0184254 A1 * | 8/2005 | Matsumoto et al. | | 250/492.21 |

FOREIGN PATENT DOCUMENTS

| | | | |
|---|---|---|---|
| JP | 03-173441 | * | 7/1991 |
| JP | 11-233450 | * | 8/1997 |
| JP | 11-086774 | * | 3/1999 |

* cited by examiner

*Primary Examiner*—Bradley K Smith
(74) *Attorney, Agent, or Firm*—Peter K. McLarty; W. James Brady, III; Frederick J. Telecky, Jr.

(57) ABSTRACT

The present invention provides a method for placing a dopant in a substrate and a method for manufacturing an integrated circuit. The method for placing a dopant in a substrate, among other steps, includes providing a substrate (340) and implanting a dopant within the substrate (340) using an implant (370), the implant (370) moving at varying speeds across the substrate (340) to provide different concentrations of the dopant within the substrate (340).

11 Claims, 4 Drawing Sheets

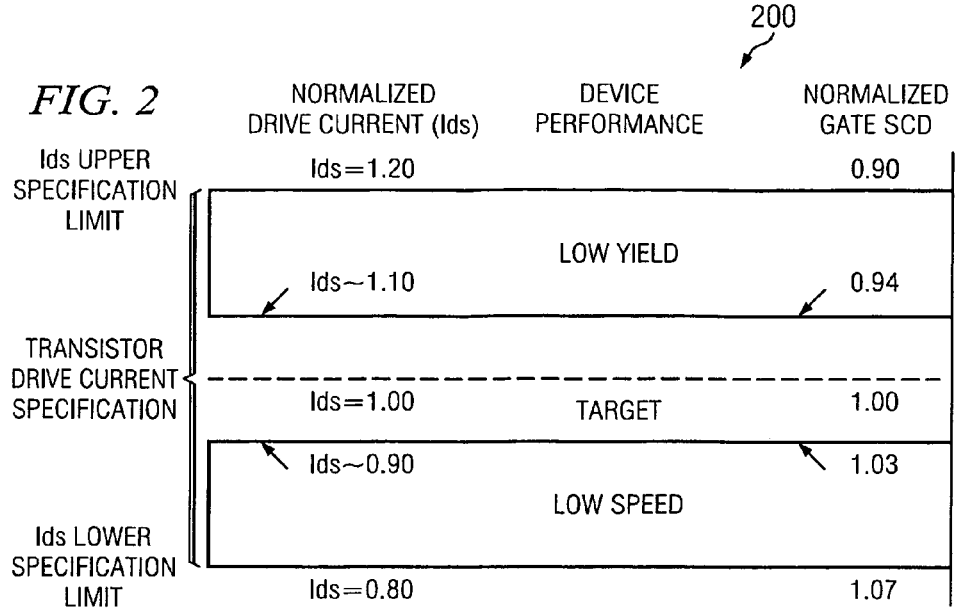
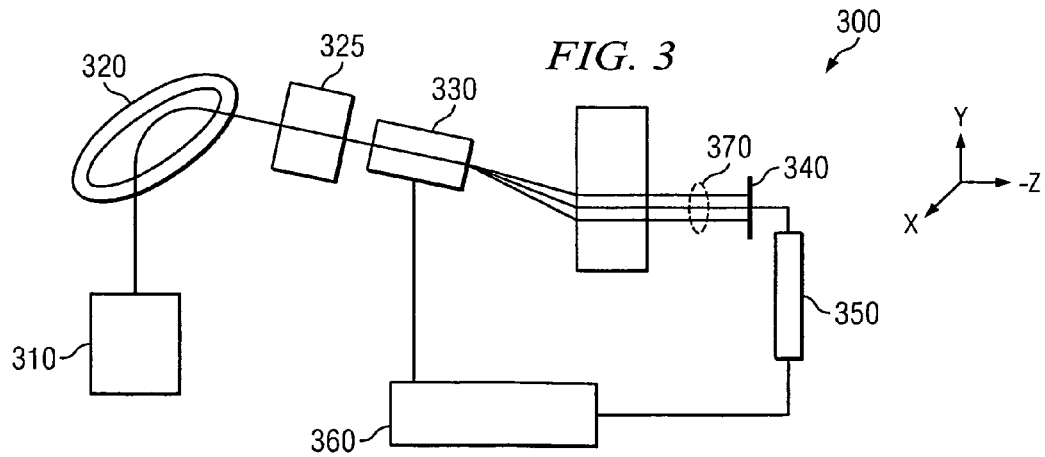

US 7,208,330 B2

METHOD FOR VARYING THE UNIFORMITY OF A DOPANT AS IT IS PLACED IN A SUBSTRATE BY VARYING THE SPEED OF THE IMPLANT ACROSS THE SUBSTRATE

TECHNICAL FIELD OF THE INVENTION

The present invention is directed, in general, to a method for varying the uniformity of a dopant as it is placed in a substrate and, more specifically, to a method for varying the uniformity of a dopant as it is placed in a substrate by varying the speed of the implant across the substrate.

BACKGROUND OF THE INVENTION

Current demands for high density and performance associated with ultra large scale integration require submicron features, increased transistor and circuit speeds, and improved reliability. Such demands require formation of device features with high precision and uniformity, which in turn necessitates careful process monitoring, including frequent and detailed inspections of the devices while they are still in the form of semiconductor wafers.

One important process requiring careful inspection is photolithography, wherein masks are used to transfer circuitry patterns to semiconductor wafers. Typically, a series of such masks are employed in a preset sequence. Each photolithographic mask includes an intricate set of geometric patterns corresponding to the circuit components to be integrated onto the wafer. Each mask in the series is used to transfer its corresponding pattern onto a photosensitive layer (e.g., a photoresist layer), which has been previously coated on a layer, such as a polysilicon or metal layer formed on the silicon wafer. An optical exposure tool such as a scanner or a stepper, which directs light or other radiation through the mask to expose the photoresist, conventionally performs the transfer of the mask pattern onto the photoresist layer. The photoresist is thereafter developed to form a photoresist mask, and the underlying polysilicon or metal layer is selectively etched in accordance with the mask to form features such as lines or gates.

Fabrication of the mask follows a set of predetermined design rules set by processing and design limitations. These design rules define the space tolerance between devices and interconnecting lines and the width of the lines themselves, to ensure that the devices or lines do not overlap or interact with one another in undesirable ways. Design rules set limits on critical dimensions ("CD"), which may be defined as any line width of interest in a device containing a number of different line widths. The CD for most features in ultra large scale integration applications is on the order of a fraction of a micron, however, it generally depends on the specific feature.

As design rules shrink and process windows (i.e., the margins for error in processing) become smaller, inspection and measurement of the surface features' profiles, which may include the surface features' CDs and sidewall angles, are becoming increasingly important. Deviations of a feature's CD and sidewall angle from design dimensions may adversely affect the performance of the finished semiconductor device, particularly the finished semiconductor device's drive current.

Accordingly, what is needed in the art is a simple, cost-effective methodology for fast and meaningful identification of a feature's profile variation, as well as correction of any drive current issues that might be associated with the variation.

SUMMARY OF THE INVENTION

To address the above-discussed deficiencies of the prior art, the present invention provides a method for placing a dopant in a substrate and a method for manufacturing an integrated circuit. The method for placing a dopant in a substrate, among other steps, includes providing a substrate and implanting a dopant within the substrate using an implant, the implant moving at varying speeds across the substrate to provide different concentrations of the dopant within the substrate.

The method for manufacturing an integrated circuit, on the other hand, includes the following steps: (1) providing gate structures over a substrate, (2) implanting a dopant within the substrate and proximate the gate structures using an implant, the implant moving at varying speeds across the substrate to provide different concentrations of the dopant within the substrate, and (3) forming interconnects within dielectric layers located over the gate structures to form an operational integrated circuit.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying FIGUREs. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which:

FIG. 2 illustrates a table of known values for gate structure profiles;

FIG. 3 illustrates one embodiment of an implant system that might be used to implant the dopant, and particularly the pocket implant, within the substrates of the one or more wafers;

DETAILED DESCRIPTION

The present invention begins with the recognition that profiles of gate structures in semiconductor devices are very relevant to the semiconductor devices' electrical properties, including drive current, threshold voltage, etc. Given this recognition, the present invention has developed a unique process configured to minimize the problems resulting from variations in gate structures critical dimensions (CDs), and thus the electrical properties, for a collection of similarly designed semiconductor devices. More specifically, the present invention has recognized that the variations in gate structures CDs, and thus electrical properties, may be minimized by intentionally varying the speed of the implant across the substrate to provide different concentrations of the dopant within the substrate. This is particularly the case with a pocket implant or source/drain extension implant, whose dopant concentrations are highly relevant to the electrical, properties of the semiconductor devices.

Moreover, not only has the present invention recognized the benefits of varying the speed of the implant across the substrate to provide different concentrations of the dopant within the substrate, but the present invention has recognized that information representative of the profiles of the gate structures may be fed forward to the implant process to adjust the speed of the implant based on the profiles. Accordingly, the present invention provides for within wafer tailoring of the implant concentration based on the speed of the implant across the substrate, allowing various different regions within the substrate to be tailored individually. Thus, where the profiles for gate structures on a first region of a substrate are different than profiles for gate structures on a second region of the substrate, the implant concentration may be independently tailored for the different regions to provide similar electrical properties for both.

For example, the dopant concentration within the substrate across the wafer may be adjusted by varying the implant scan rate, substrate scan rate, or both. Thus, concentration adjustments may be made by slowing down the scan rates where an increase in concentration is needed or increasing the scan rate where a decrease in concentration is needed. These speed adjustments may be made in a variety of patterns, including top-to-bottom across the wafer or left-to-right across the wafer based on adjusting one of the implant scan rate or substrate scan rate, or alternatively, radially from the center of the wafer or a random pattern based on adjusting both the implant scan rate and substrate scan rate. What optimally results are semiconductor devices having substantially similar electrical properties, regardless of the differences in the gate structure profiles, across a given type of semiconductor devices.

Figure 1:
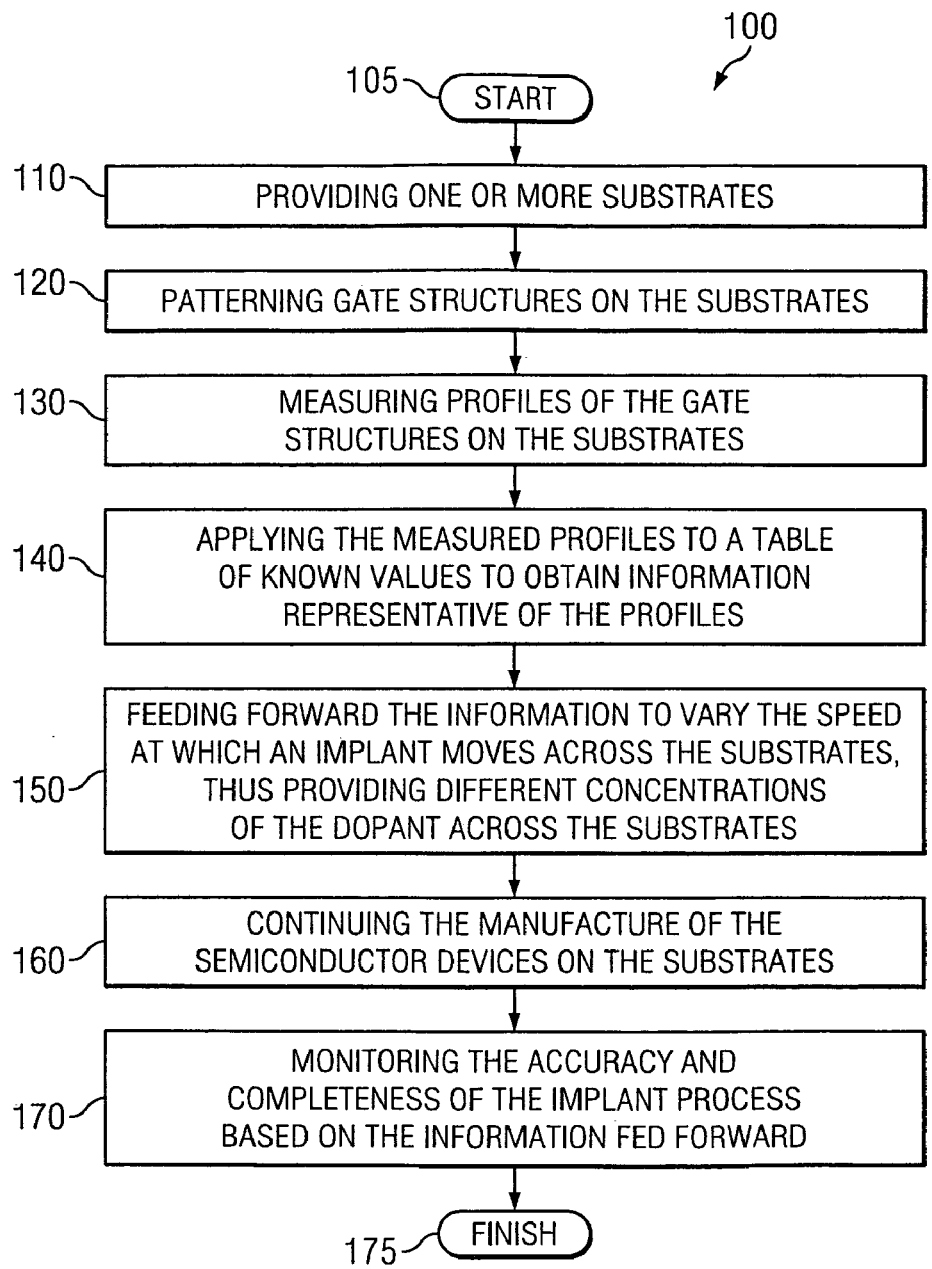
FIG. 1 illustrates a flow diagram depicting one embodiment of a method for manufacturing an integrated circuit by placing a dopant within a substrate in accordance with the principles of the present invention.

Turning now to FIG. 1, illustrated is a flow diagram 100 depicting one embodiment of a method for manufacturing an integrated circuit by placing a dopant within a substrate in accordance with the principles of the present invention. While the flow diagram 100 depicted in FIG. 1 includes about nine specific steps, those skilled in the art understand that fewer or more steps could be used and remain within the scope of the present invention. While many of the additional steps will not be discussed, certain ones of those additional steps will be discussed.

The method for manufacturing the integrated circuit begins in step 105. Thereafter, in a step 110, one or more substrates are obtained. The one or more substrates may be any known or hereafter discovered substrate that currently is or will be used in the manufacture of semiconductor devices. In the exemplary embodiment of the present invention, the one or more substrates are standard silicon wafers that have been processed up to the step of patterning the gate structures thereon. That is, the wafers already include isolation structures, any pre-pattern implants, a gate dielectric layer and a gate electrode layer thereon.

After obtaining the one or more substrates, which as discussed above may have a number of different features thereon, gate structures are patterned on each of the one or more substrates in a step 120. As is often the case, the gate structures on each of the one or more substrates are patterned as a lot, for example either sequentially or simultaneously. The present invention is not, however, limited to the aforementioned patterning scheme.

The gate structure patterning process of step 120 is conventional. For example, any exemplary lithographic process may be used to pattern the gate structures. Lithography refers to a process for pattern transfer between various media. The lithographic process may include forming a radiation sensitive resist coating over the layer to be patterned, in this case the blanket layers of gate dielectric material and gate electrode material. The radiation sensitive resist coating may then be patterned by selectively exposing the resist through a mask. In turn, the exposed areas of the coating become either more or less soluble than the unexposed areas, depending on the type of resist. A solvent developer may then be used to remove the less soluble areas leaving the patterned resist layer. After the resist layer is patterned, the gate structures may be etched using the patterned resist layer as a mask to transfer the pattern to the blanket layers of gate dielectric material and gate electrode material. Etch processes, among others, might include plasma etching, reactive ion etching, wet etching, or combinations thereof.

It is known that variations in the photolithography and etch processes often provides gate structures having different profiles from one another, whether it be across the wafer, or wafer-by-wafer. For example, within the wafer, the photolithographic exposure tool might have different degrees of focus at one edge of the wafer than it has at the opposite edge of the wafer, thus resulting in variations of the gate structure profiles at the first edge of the wafer from those at the opposite edge of the wafer. Additionally, on a wafer-by-wafer basis, the removal of one wafer from the photolithography or etching device and placement of a different wafer within the device may cause the profiles of the gate structures on the first wafer to be different from the profiles of the gate structures on the second wafer. Other process variables, whether within the wafer or on a wafer-by-wafer basis, may also affect the profiles.

After patterning the gate structures in step 120, the profiles of the gate structures on each of the one or more substrates may be measured in a step 130. While many different devices and techniques may be used to measure the various profiles of the gate structures on the one or more substrates, the present invention believes that a scatterometer is best suited at this time. Whether it be integrated or stand alone, the scatterometer provides quick, accurate and reliable gate structure profile information. Previous techniques, such as using a scanning electron microscopes (SEM), typically cannot accurately provide this information. Further, even if the previous techniques were able to obtain this data, those techniques would be entirely too slow to be practical.

The gate structure profile information that is obtained may include one or more features. In an exemplary embodiment, the gate critical dimension (CD) is the gate structure profile measured. Nevertheless, gate structure sidewall angle, as well as other pertinent profile information, may also be obtained in the step 130.

Thereafter, in a step 140, the measured profiles for the gate structures of each of the one or more substrates is compared to a table of known values for gate structure profiles, to obtain information representative of the profiles for the gate structures of the different substrates. Turning briefly to FIG. 2, depicted is an illustrative example of such a table 200. With reference to FIG. 2, the table might apply the gate CD measurements of the substrates to known parametric transistor specifications to determine the drive current of the device that will result. This information may then be used to determine what, if any, increase or decrease in dopant concentration may need to be used to optimize the performance of the resulting transistor based upon the measured gate structure profile for each of the one or more substrates.

After determining what, if any, increase or decrease in dopant concentration may need to be used to optimize the performance of the resulting transistors for each of the one or more substrates, in a step 150, that representative information may be fed forward to the implanter to alter, or in an exemplary embodiment optimize, the drive current of the semiconductor devices on the one or more substrates. Again, this information may be fed forward on a wafer-by-wafer basis, or in an exemplary basis, on a within wafer basis. Advantageously, this allows systematic and random within wafer and wafer-to-wafer gate structure profile variations to be minimized, as related to transistor drive current. Those skilled in the art understand the many different ways in which this information may be fed forward to affect the transistor drive current on either a within wafer or wafer-by-wafer basis.

Turning briefly to FIG. 3, illustrated is one embodiment of an implant system 300 that might be used to implant the dopant, and particularly a pocket implant or source/drain extension implant, within the substrates of the one or more wafers. The implant system 300 illustrated in FIG. 3 initially includes a conventional source 310, conventional magnets 320, 325, a conventional electrostatic deflector 330, and a substrate 340 coupled to a moving platform 350. The implant system 300 further includes a control subsystem 360. The implant system 300 illustrated in FIG. 3 represents but one implant system that is within the scope of the present invention. For instance, the implant system 300 illustrated in FIG. 3 is a single wafer ion implanter, similar to the E220/E500 ion implanter manufactured by Varian Semiconductor; however, other implanters, including multi-wafer implanters could also be used.

Unique to the present invention, likely using the information representative of the profiles of the gate structures obtained in step 140 above, the implant system 300 implants a dopant within the substrate 340 using an implant 370, the implant 370 moving at varying speeds across the substrate 340 to provide different concentrations of the dopant within the substrate 340. As one would expect, a number of various different features, many of which are already currently available in some conventional implanters, could be used to vary the speed of the implant 370 across the substrate 340. For instance, as shown in FIG. 3, the implant 370 scan rate may be varied using the conventional electrostatic deflector 330 in the y-direction. As also shown in FIG. 3, the substrate 340 scan rate may be varied using the conventional moving platform 350 in the x-direction (e.g., substantially perpendicular to the y-direction). It is also possible for the conventional moving platform 350 to allow movement in the y-direction, thereby allowing the substrate 340 scan rate to be varied in the y-direction. Nevertheless, one or any combination of the features could be used to vary the scan rate in the x-direction or y-direction, or both the x-direction and y-direction.

Figure 4A:
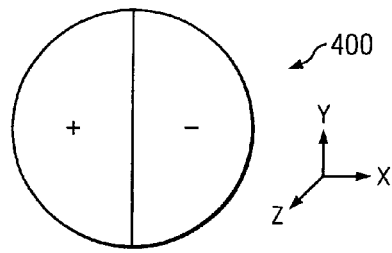
FIGS. 4A–4D illustrate dose adjustment patterns that may be obtained using the inventive aspects of the present invention.
Figure 4C:
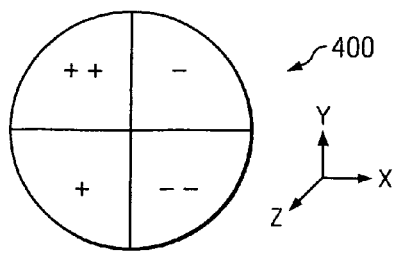
Figure 4B:
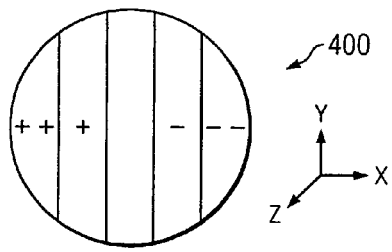
Figure 4D:
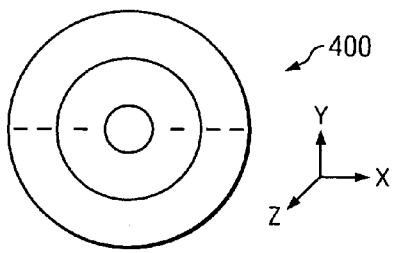

Turning briefly to FIGS. 4A–4D, illustrated are certain dose adjustment patterns that may be obtained using the inventive aspects of the present invention. For example, FIG. 4A illustrates that varying the speed of the implant 370 across the substrate 340 allows for a left to right split dose adjustment in the substrate 340. While not shown, equally possible is a top to bottom split dose adjustment in the substrate 340. FIG. 4B, on the other hand, illustrates that varying the speed of the implant 370 across the substrate 340 allows for a left to right gradient dose adjustment in the substrate 340. Again, the top to bottom gradient dose adjustment could also be obtained. FIG. 4C illustrates that varying the speed of the implant 370 across the substrate 340 allows for quadrant dose adjustment in the substrate 340. Additionally, FIG. 4D illustrates that varying the speed of the implant 370 across the substrate 340 in both the x-direction and y-direction allows for a radial dose adjustment in the substrate 340.

Those skilled in the art understand the mechanism by which the speed of the implant 370 across the substrate 340 may be controlled. For instance, those skilled in the art understand that a control subsystem, such as the control system 360, and its associated hardware and/or software, could be fed the information representative of the profiles of the gate structures on the substrate 340 and control the speed of the implant 370 in both the x-direction and y-direction. Other systems or subsystems could nevertheless be used to control the speed of the implant 370 across the substrate 340.

Returning to FIG. 1, in a step 160, after implanting the dopant within the substrate using the implant moving at varying speeds across the substrate to provide different concentrations of the dopant within the substrate based on information representative of the gate structure profiles, the manufacturing of the semiconductor devices may continue for the substrates. As one would expect, the additional manufacturing steps might include the formation of interlevel dielectric layers over the gate structures, and formation of interconnects within the interlevel dielectric layers to form an operational integrated circuit.

Thereafter, in an optional step 170, the accuracy and completeness of the tailored implant based on the information fed forward, may be monitored. This may include, without limitation, measuring at least one wafer per lot that was subjected to the tailored implant using an inline parametric probe. Not only does this information test the accuracy of the process, it allows certain information to be fed back to further optimize the process. The process could then repeat with steps 110 thru 170, or alternatively finish in a step 175.

It should be noted that a number of various procedures or steps that might occur during a typical method consistent with the flow diagram of FIG. 1 are not shown therein. For example, not only should the gate structure profile information be fed forward, that gate structure profile information should be attributed to a specific wafer. Thus, the gate structure profile information might have the wafer number, location, slot position, etc., encoded therewith. Other procedures or steps not shown will undoubtedly also exist. Nevertheless, one skilled in the art would know those steps.

Figure 5:
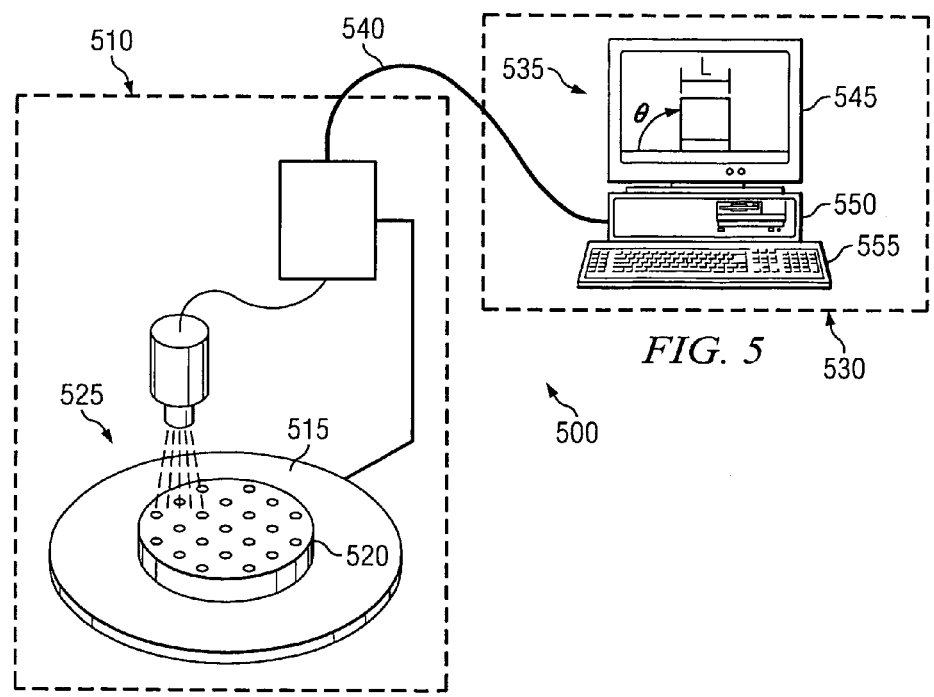
FIG. 5 illustrates a partial sectional view of an exemplary embodiment of a system for measuring profiles of the gate structures on each of the one or more substrates, applying the measured profiles to a table of known values to obtain information representative of the profiles, feeding forward the information to alter the implant speed across the substrate, or any one or combination of those steps in FIG. 1.

Referring briefly to FIG. 5, illustrated is a partial sectional view of an exemplary embodiment of a system 500 for measuring profiles of the gate structures on each of the one or more substrates, applying the measured profiles to a table of known values to obtain information representative of the profiles, feeding forward the information to alter the implant speed across the substrate, or any one or combination of those steps in accordance with steps 130, 140, and 150 of FIG. 1. It should initially be noted that the system 500 may include many objects, and is not limited by what is illustrated in the embodiment shown in FIG. 5.

In the embodiment shown in FIG. 5, the system 500 includes a detection subsystem 510 and a comparison subsystem 530. The detection subsystem 510, in a preferred embodiment of the invention, may include a scatterometer 525. It should be noted, however, that the detection subsystem 510 might include other subsystems designed to measure the profiles of the gate structures and remain within the scope of the present invention.

As previously mentioned, the system 500 may further include a comparison subsystem 530. The comparison subsystem 530 may include any subsystem capable of accurately comparing information obtained from the detection subsystem 510. In the embodiment illustrated in FIG. 5, the comparison subsystem 530 includes a computer subsystem 535. The computer subsystem 535 may be coupled to the detection subsystem 510 via a cable 540, and may be configured to receive and process information from the detection subsystem 510. In one embodiment of the present invention, the computer subsystem 535 may be software residing on a conventional personal computer. The software embodiment includes source code, object code, libraries, executable programs and other software structures that cooperatively function together to achieve the functionality of the present invention. The computer subsystem 535 may also include a monitor 545, a chassis 550 or a keyboard 555. Alternatively, however, the monitor 545 and the keyboard 555 may be replaced by other conventional output and input devices, respectively.

It should be noted that any conventional computer system having at least one CPU that is suitable to function as the computer subsystem 535, including without limitation, hand-held units, laptop/notebooks, minis, mainframes and supercomputers, including RISC and parallel processing architectures, as well as combinations of such systems, may be used. Conventional computer system architecture is more fully discussed in Computer Organization and Architecture, by William Stallings, MacMillan Publishing Co. (3rd ed. 1993), which is also incorporated herein by reference. Alternative computer system embodiments may be firmware-based or hardware-based. It should also be noted that the comparison subsystem 530 is not limited to an external source and may be included within a logic provided in the detection subsystem 510. Moreover, the comparison subsystem 530 could be included within the software or factory automation of the implant tool, without departing from the scope of the present invention.

The comparison subsystem 530, in addition to the features discussed above has the ability to feed forward the information that it obtains to other manufacturing subsystems, for example a subsystem capable of implanting dopants. It should be noted again that the system 500, and more particularly its components, is just one embodiment of a system that could be used to effectuate the unique method of the present invention.

Figure 6:
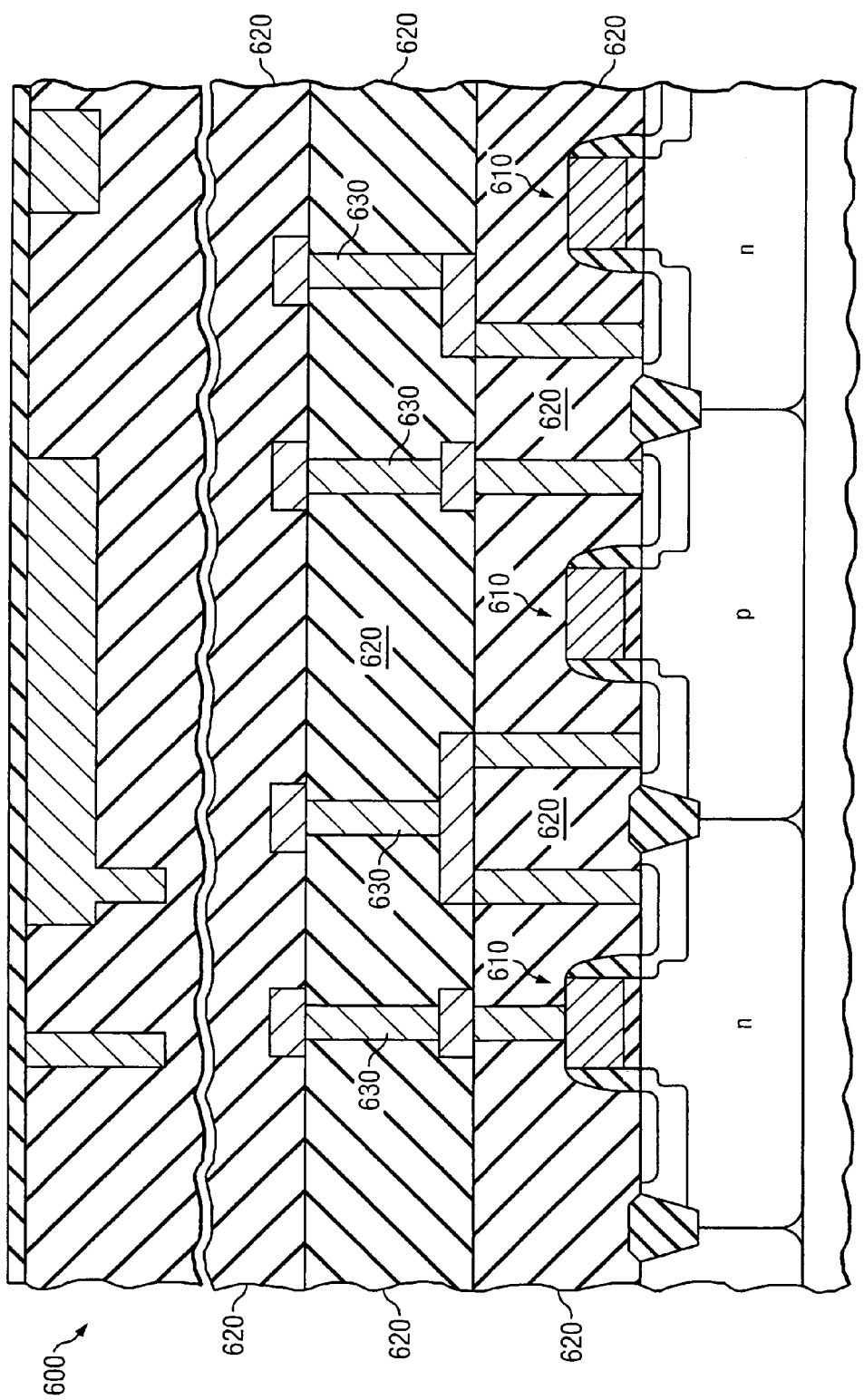
FIG. 6 illustrates an exemplary cross-sectional view of an integrated circuit (IC) constructed according to the principles of the present invention.

Referring now to FIG. 6, illustrated is an exemplary cross-sectional view of an integrated circuit (IC) 600 constructed according to the principles of the present invention. The IC 600 may include devices, such as transistors used to form CMOS devices, BiCMOS devices, Bipolar devices, as well as capacitors or other types of devices. The IC 600 may further include passive devices, such as inductors or resistors, or it may also include optical devices or optoelectronic devices. Those skilled in the art are familiar with these various types of devices and their manufacture. In the particular embodiment illustrated in FIG. 6, the IC 600 includes the devices 610 having dielectric layers 620 located thereover. Additionally, interconnect structures 630 are located within the dielectric layers 620 to interconnect various devices, thus, forming the operational integrated circuit 600.

Although the present invention has been described in detail, those skilled in the art should understand that they can make various changes, substitutions and alterations herein without departing from the spirit and scope of the invention in its broadest form.

What is claimed is:

1. A method for placing a dopant in a semiconductor substrate, comprising:

providing a substrate comprising at least a first portion and a second portion;

implanting a dopant within the substrate using a dopant implant process, the dopant implant process being performed at varying rates across the substrate to provide different concentrations of the dopant within the first portion and the second portion of the substrate; and wherein said varying rates are determined by performing measurements on said substrate, and using the results obtained from said measurements to determine how to vary the speed that the dopant implant process is performed across the substrate.

2. The method as recited in claim 1 wherein performing measurements on said substrate comprises measuring the profiles of gate structures located on the substrate.

3. The method as recited in claim 2 wherein the profiles of the gate structures are measured using a scatterometer.

4. The method as recited in claim 1 wherein the dopant implant process is a pocket implant or source/drain extension implant.

5. A method for manufacturing an integrated circuit, comprising;

forming gate structures over a substrate;

measuring the profiles of said gate structures;

varying a speed at which a dopant implant process is performed across the substrate based on the measuring of the profiles of said gate structures to provide different concentrations of the dopant proximate the gate structures within the substrate; and forming interconnects within dielectric layer located over the gate structures to form an operational integrated circuit.

6. The method as recited in claim 5 wherein varying an implant scan rate in a direction causes varying the speed at which the dopant implant process is performed across the substrate.

7. The method as recited in claim 5 wherein varying a substrate scan rate in a direction causes varying the speed at which the dopant implant process is performed across the substrate.

8. The method as recited in claim 5 wherein the measuring the profiles of said gate structures is performed using a scatterometer.

9. The method as recited in claim 5 wherein varying the speed at which the dopant implant process is performed across the substrate results in quadrant dose adjustments in the substrate.

10. The method as recited in claim 5 wherein varying the speed at which the dopant implant process is performed across the substrate results in radial dose adjustments in the substrate.

11. The method as recited in claim 5 wherein the dopant implant process is a pocket implant or source/drain extension implant.

* * * * *